US012802769B2

(12) United States Patent
Chawla et al.

(10) Patent No.: US 12,802,769 B2
(45) **Date of Patent: *Nov. 17, 2026**

(54) BUILT-IN SELF TEST CIRCUIT FOR SEGMENTED STATIC RANDOM ACCESS MEMORY (SRAM) ARRAY INPUT/OUTPUT

(71) Applicant: STMicroelectronics International N.V., Geneva (CH)

(72) Inventors: Hitesh Chawla, Noida (IN); Tanuj Kumar, Noida (IN); Bhupender Singh, New Delhi (IN); Harsh Rawat, Faridabad (IN); Kedar Janardan Dhori, Ghaziabad (IN); Manuj Ayodhyawasi, Noida (IN); Nitin Chawla, Noida (IN); Promod Kumar, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 29 days.

This patent is subject to a terminal disclaimer.

(21) Appl. No.: 18/939,751

(22) Filed: Nov. 7, 2024

(65) Prior Publication Data

US 2025/0069678 A1 Feb. 27, 2025

Related U.S. Application Data

(63) Continuation of application No. 18/227,545, filed on Jul. 28, 2023, now Pat. No. 12,170,120.

(Continued)

(51) Int. Cl.

| | |
|---|---|
| ***G11C 29/00*** | (2006.01) |
| ***G11C 29/12*** | (2006.01) |
| ***G11C 29/36*** | (2006.01) |

(52) U.S. Cl.

CPC .......... *G11C 29/1201* (2013.01); *G11C 29/36* (2013.01); *G11C 2029/1202* (2013.01);

(Continued)

(58) Field of Classification Search

CPC ........ G11C 2029/1202; G11C 11/4097; G11C 11/4096; G11C 29/10; G11C 29/36; G11C 29/1204; G11C 29/1201; G11C 2029/3602

See application file for complete search history.

(56) References Cited

U.S. PATENT DOCUMENTS

| | | | |
|---|---|---|---|
| 5,568,437 | A | 10/1996 | Jamal |
| 6,006,347 | A | 12/1999 | Churchill et al. |

(Continued)

FOREIGN PATENT DOCUMENTS

| | | | |
|---|---|---|---|
| CN | 103065687 | A | 4/2013 |

*Primary Examiner* — Esaw T Abraham

(74) *Attorney, Agent, or Firm* — Crowe & Dunlevy LLC

(57) ABSTRACT

The memory array of a memory includes sub-arrays with memory cells arranged in a row-column matrix where each row includes a word line and each sub-array column includes a local bit line. A row decoder circuit supports two modes of memory circuit operation: a first mode where only one word line in the memory array is actuated during a memory read and a second mode where one word line per sub-array are simultaneously actuated during the memory read. An input/output circuit for each column includes inputs to the local bit lines of the sub-arrays, a column data output coupled to the bit line inputs, and a sub-array data output coupled to each bit line input. Both BIST and ATPG testing of the input/output circuit are supported. For BIST testing, multiple data paths between the bit line inputs and the column data output are selectively controlled to provide complete circuit testing.

27 Claims, 8 Drawing Sheets

Related U.S. Application Data

(60) Provisional application No. 63/402,182, filed on Aug. 30, 2022.

(52) U.S. Cl.
CPC ................ *G11C 2029/1204* (2013.01); *G11C 2029/3602* (2013.01)

(56) References Cited

U.S. PATENT DOCUMENTS

| | | | | |
|---|---|---|---|---|
| 7,366,965 | B2 | 4/2008 | Yamasaki et al. | |
| 7,508,725 | B2 | 3/2009 | Sugiura et al. | |
| 7,607,055 | B2 * | 10/2009 | Jung .................. | G11C 29/1201 714/724 |
| 7,656,726 | B2 * | 2/2010 | Cheng ............. | G01R 31/31724 365/201 |
| 8,924,805 | B2 | 12/2014 | Sul et al. | |
| 8,966,329 | B2 | 2/2015 | Clark et al. | |
| 9,412,437 | B2 | 8/2016 | Deng et al. | |
| 10,037,817 | B2 | 7/2018 | Her et al. | |
| 10,268,389 | B2 | 4/2019 | Lea | |
| 10,720,205 | B2 | 7/2020 | Huang et al. | |
| 10,726,935 | B2 * | 7/2020 | Lee ........................ | G11C 29/36 |
| 11,080,226 | B2 | 8/2021 | Tomishima et al. | |
| 11,264,115 | B2 * | 3/2022 | Schreiber ............. | G11C 7/1045 |
| 11,501,846 | B2 * | 11/2022 | Kim ................. | G11C 29/56004 |
| 11,742,045 | B2 | 8/2023 | Bhasin et al. | |
| 2020/0005128 | A1 | 1/2020 | Temam et al. | |

* cited by examiner

BUILT-IN SELF TEST CIRCUIT FOR SEGMENTED STATIC RANDOM ACCESS MEMORY (SRAM) ARRAY INPUT/OUTPUT

CROSS REFERENCE TO RELATED APPLICATIONS

This application is a continuation of U.S. patent application Ser. No. 18/227,545, filed Jul. 28, 2023, now U.S. Pat. No. 12,170,120, which claims priority from U.S. Provisional Application for Patent No. 63/402,182, filed Aug. 30, 2022, the disclosures of which are incorporated herein by reference.

TECHNICAL FIELD

Embodiments herein relate to built-in self test (BIST) circuitry and, in particular, to BIST circuitry used for testing an input/output (I/O) circuit of a segmented static random access memory (SRAM) array.

BACKGROUND

A conventional memory circuit 10 as shown in FIG. 1 may include a static random access memory (SRAM) array 12 formed by a plurality of SRAM memory cells 14 arranged in a matrix format having N rows and M columns. Each SRAM memory cell is of a well-known 8T-type (see, FIG. 2) and includes a word line WL, a pair of complementary (write) bit lines BLT and BLC, a read word line RWL and a read bit line RBL. The SRAM memory cells in a common row of the matrix are connected to each other through a common word line WL and through a common read word line RWL. Each of the word lines (WL and/or RWL) is driven by a word line driver circuit 16 with a word line signal generated by a row decoder circuit 18 during read and write operations. The SRAM memory cells in a common column of the matrix across the whole array 12 are connected to each other through a common pair of complementary bit lines BLT and BLC and through a common read bit line RBL. Each of the bit lines (BLT, BLC and RBL) is coupled to a column input/output (I/O) circuit 20. A data input port (D) of the column I/O circuit 20 receives input data to be written to an SRAM memory cell 14 in the column through the bit lines BLT, BLC in response to assertion of a word line signal. A data output port (Q) of the column I/O circuit 20 generates output data read from an SRAM memory cell 14 in the column through the read bit line RBL in response to assertion of a read word line signal. A control circuit controls operations of the circuitry within the memory.

With reference now to FIG. 2, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. A signal path between the read bit line RBL and the low supply voltage reference is formed by series coupled transistors 38 and 40. The gate terminal of the (read) transistor 38 is coupled to the complement storage node QC and the gate terminal of the (transfer) transistor 40 is coupled to receive the signal on the read word line RWL. The word line driver circuits 16 are also typically coupled to receive the high supply voltage (Vdd) at the high supply node and is referenced to the low supply voltage (Gnd) at the low supply node.

SUMMARY

In an embodiment, a memory circuit comprises: a memory array including a plurality of sub-arrays, wherein each sub-array includes memory cells arranged in a matrix with plural rows and plural columns, each row including a word line connected to the memory cells of the row, and each column including a local bit line connected to the memory cells of the column; a word line drive circuit for each row having an output connected to drive the word line of the row; a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read; and an input/output circuit for each column.

Each input/output circuit comprises: a plurality of bit line inputs coupled to the local bit lines of the sub-arrays; a column data output coupled to the plurality of bit line inputs; and a plurality of sub-array data outputs, where each sub-array data output is coupled to a corresponding bit line input.

In an embodiment, built-in self test (BIST) operations are supported for the read circuitry of each input/output circuit using multiple data paths which are selectable through multiplexing functions to couple test data between the plurality of bit line inputs and the column data output.

In an embodiment, automated test pattern generation (ATPG) operations are supported for the read circuitry of each input/output circuit using sensing circuitry that receives both ATPG test pattern data and data from the plurality of bit line inputs. ATPG test data is output from either or both the column data output and/or the sub-array data outputs.

In an embodiment, the input/output circuit for each column comprises: between each bit line input and corresponding sub-array data output, a first latch circuit and a first buffer circuit; a first multiplexing circuit having inputs coupled to the plurality of sub-array data outputs; a second multiplexing circuit having inputs coupled to the plurality of bit line inputs; a third multiplexing circuit having inputs coupled to outputs of the first and second multiplexing circuits; and between an output of the third multiplexing circuit and the column data output, a second latch circuit and a second buffer circuit.

In an embodiment, the input/output circuit for each column comprises: between each bit line input and corresponding sub-array data output, a first latch circuit and a first buffer circuit; a first multiplexing circuit having inputs coupled to the plurality of sub-array data outputs; a second multiplexing circuit having inputs coupled to the plurality of bit line inputs; between an output of the second multiplexing circuit and the column data output, a second latch circuit and a second buffer circuit; a third multiplexing circuit having inputs coupled to an output of the first multiplexing circuit and the column data output; and between an output of the third multiplexing circuit and a column test data output, a third latch circuit and a third buffer circuit.

In an embodiment, the input/output circuit for each column comprises: between each bit line input and corresponding sub-array data output, a first latch circuit and a first buffer circuit; a first multiplexing circuit having inputs coupled to the plurality of sub-array data outputs; a second multiplexing circuit having inputs coupled to the plurality of bit line inputs; between an output of the second multiplexing circuit and the column data output, a second latch circuit and a second buffer circuit; and between an output of the second multiplexing circuit and a column test data output, a third latch circuit and a third buffer circuit.

In an embodiment, the input/output circuit for each column comprises: between each bit line input and corresponding sub-array data output, a first latch circuit and a first buffer circuit; a multiplexing circuit having inputs coupled to the plurality of sub-array data outputs; and between an output of the multiplexing circuit and the column data output, a second latch circuit and a second buffer circuit.

In an embodiment, the input/output circuit for each column comprises: between each bit line input and corresponding sub-array data output, a first latch circuit and a first buffer circuit; a multiplexing circuit having inputs coupled to the bit line inputs; and between an output of the multiplexing circuit and the column data output, a second latch circuit and a second buffer circuit.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
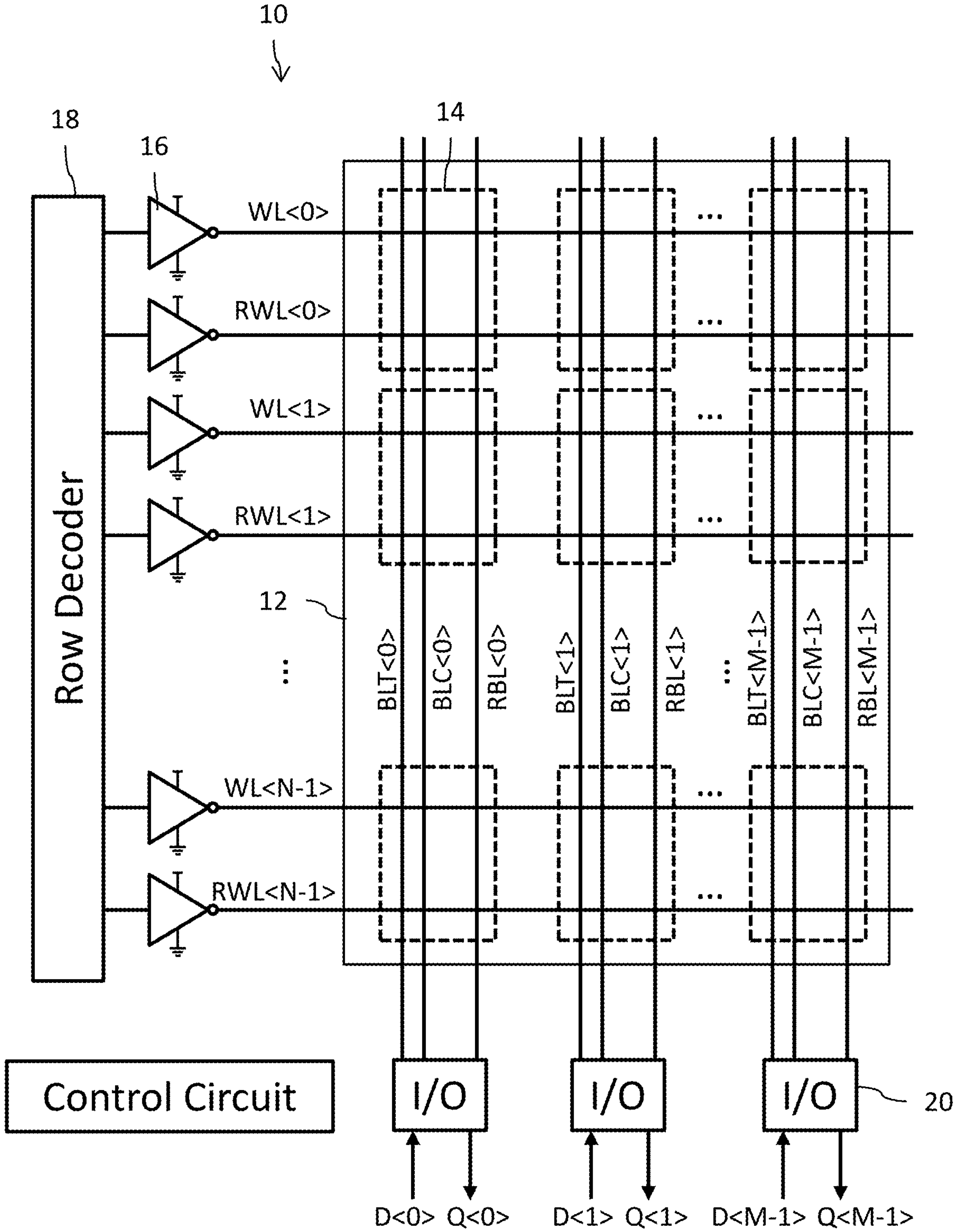
FIG. 1 (Prior Art)
FIG. 1 is a schematic diagram of a conventional memory circuit.
Figure 2:
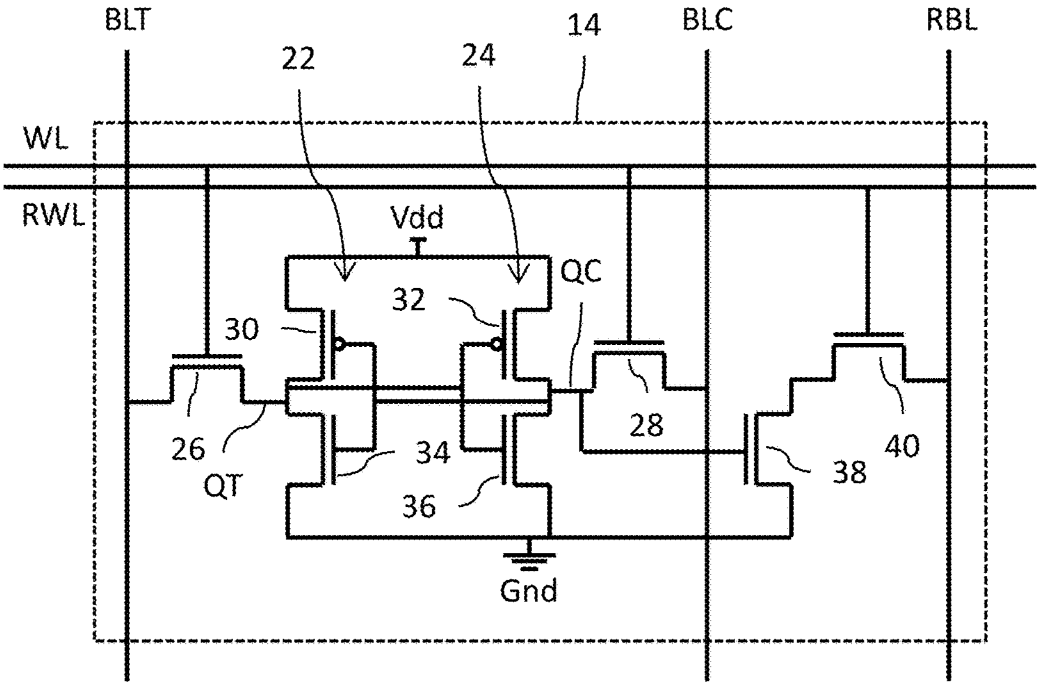
FIG. 2 (Prior Art)
FIG. 2 is a circuit diagram of a standard 8T static random access memory (SRAM) cell as used the memory array shown in FIG. 1.
Figure 3:
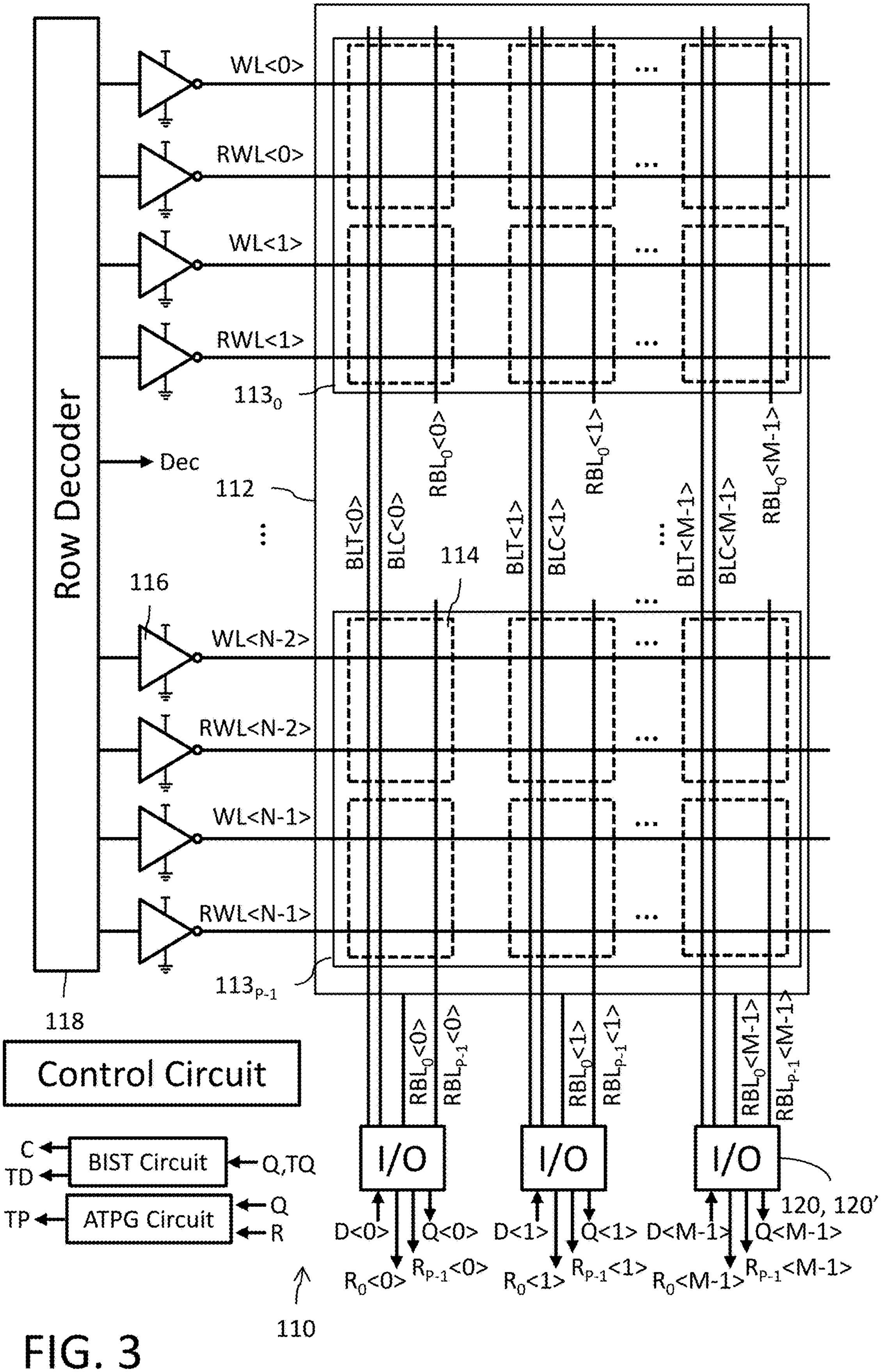
FIG. 3 is a schematic diagram of a memory circuit.

Reference is now made to FIG. 3 which shows a block diagram of a memory circuit 110. The circuit 110 includes a static random access memory (SRAM) array 112 formed by a plurality of SRAM memory cells 114 arranged in a matrix format having N rows and M columns. Each SRAM memory cell is of a well-known 8T-type (see, FIG. 2) and includes a word line WL, a pair of complementary bit lines BLT and BLC, a read word line RWL and a read bit line RBL. The SRAM memory cells in a common row of the matrix are connected to each other through a common word line WL and through a common read word line RWL. Each of the word lines (WL and/or RWL) is driven by a word line driver circuit 116 with a word line signal generated by a row decoder circuit 118 during read and write operations. The SRAM memory cells in a common column of the matrix across the whole array 112 are connected to each other through a common pair of complementary (write) bit lines BLT and BLC. The array 112 is segmented into P sub-arrays $\mathbf{113}_0$ to $\mathbf{113}_{P-1}$. Each sub-array 113 includes M columns and N/P rows of memory cells 114. The SRAM memory cells in a common column of each sub-array 113 are connected to each other through a local read bit line RBL. The P local read bit lines $RBL_0$<x> to $RBL_{P-1}$<x> from the sub-arrays 113 for the column x in the array 112 are coupled, along with the common pair of complementary bit lines BLT<x> and BLC<x> for the column x in the array 112, to a column input/output (I/O) circuit 120. A data input port (D) of the column I/O circuit 120 receives input data to be written to an SRAM memory cell 114 in the column through the bit lines BLT, BLC in response to assertion of a word line signal. A data output port (Q) of the column I/O circuit 120 generates output data read from an SRAM memory cell 14 in the column through the read bit lines RBL in response to assertion of a read word line signal in a first read mode of operation. Additionally, the column I/O circuit 120 further includes P sub-array data output ports $R_0$ to $R_{P-1}$ to generate output data read from the memory cells 114 on the local read bit line RBL of the corresponding sub-array $\mathbf{113}_0$ to $\mathbf{113}_{P-1}$, respectively, in response to the simultaneous assertion of a plurality of read word line signals (one per sub-array 113) in a second read mode of operation. A control circuit controls operations of the circuitry within the memory.

It will be understood that the circuit 110 may instead use a different type of memory cell, for example, any form of a bit cell, storage element or synaptic element. As a non-limiting example, consideration is made for the use of a non-volatile memory (NVM) cell such as, for example, magnetoresistive RAM (MRAM) cell, Flash memory cell, phase change memory (PCM) cell or resistive RAM (RRAM) cell). In the following discussion, focus is made on the implementation using an 8T-type SRAM cell 114, but this is done by way of a non-limiting example, understanding that any suitable memory element could be used (e.g., a binary (two level) storage element or an m-ary (multi-level) storage element).

When the memory circuit 110 is operating in the first read mode of operation, the row decoder circuit 118 selectively actuates only one read word line RWL for the whole array 112 with a word line signal pulse to access a corresponding single one of the rows of memory cells 114. The logic state stored in the single accessed memory cell of a column is output to the read bit line RBL and input to the column I/O circuit 120 for output at the data output port Q.

When the memory circuit 110 is operating in the second read mode of operation, the row decoder circuit 118 selectively (and simultaneously) actuates one read word line RWL in each sub-array 113 in the memory array 112 with a word line signal pulse to access a corresponding single one of the rows of memory cells 114 in each sub-array 113. The logic states stored in the single accessed memory cells for the sub-arrays 113 of each column are output to the read bit lines $RBL_0$<x> to $RBL_{P-1}$<x> and input to the column I/O circuit 120 for output at the corresponding sub-array data output ports $R_0$ to $R_{P-1}$. This second read mode of operation, for example, may be implemented in connection with operation of the memory in support of the performance of an in-memory compute operation (where, for example, the memory cells 114 store bits of weight data and feature data is supplied via the word line signal pulses on the read word lines, to a computational circuit in the I/O circuit 120, or to a digital signal processing circuit coupled to receive data from sub-array data output ports $R_0$ to $R_{P-1}$).

Figure 4:
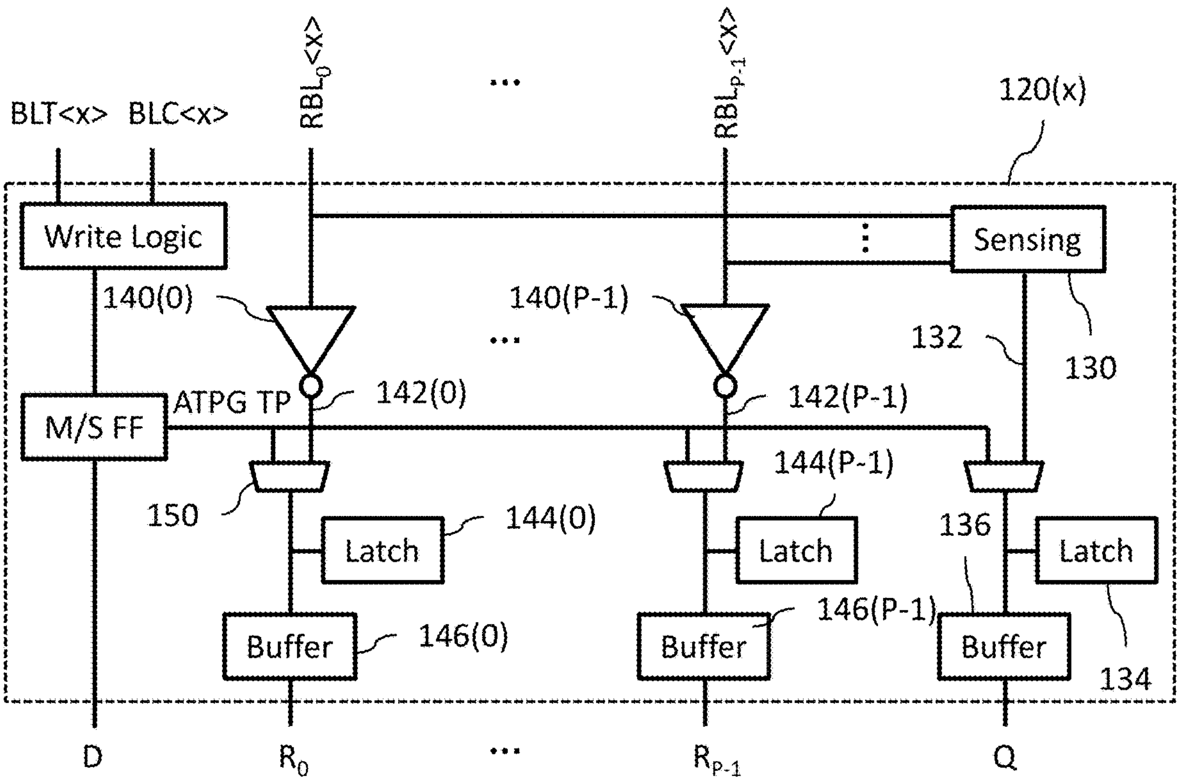
FIG. 4 shows a block diagram for an embodiment of a column I/O circuit for the memory circuit in FIG. 3.

A block diagram of an embodiment for the column I/O circuit 120 is shown in FIG. 4. Here, x=0 to M−1. The data input port D is coupled to the complementary (write) bit lines BLT and BLC through a write logic circuit. The column I/O circuit 120(*x*) is coupled to the P local read bit lines $RBL_0$<x> to $RBL_{P-1}$<x> from the sub-arrays 113 for the column x in the array 112. A sensing circuit 130 is coupled to receive the data on the P local read bit lines $RBL_0$<x> to $RBL_{P-1}$<x> and generate a sensed data bit on signal line 132. The sensed data bit is latched by latch circuit 134 and buffered by buffer circuit 136 for output at the data output port Q. A sensing circuit 140(*y*) is coupled to receive the data on the local read bit line $RBL_y$<x> and generate a sensed data bit on signal line 142(*y*). The sensed data bit is latched by latch circuit 144(*y*) and buffered by buffer circuit 146(*y*) for output at the sub-array data output port $R_y$. Here, y=0 to P−1.

It is important to be able to test the operation of the memory circuit 110. It is well known to those skilled in the art to utilize built-in self test (BIST) circuitry (see, FIG. 3) for memory testing. The data path that is typically testable using BIST circuitry is the data path from the memory array 112 (loaded by the BIST circuit with test data TD) through the sensing circuit 130, latch circuit 134 and buffer circuit 136 to the data output port Q for return back to the BIST circuit for comparison to the loaded test data. That BIST testing, however, cannot effectively test the data path from the memory array 112 through the sensing circuit(s) 140(*y*), latch circuits 144(*y*) and buffer circuit(s) 146(*y*) to the sub-array data output port(s) $R_y$. To test this circuitry, a test pattern TP may be generated by an automated test pattern generation (ATPG) circuit (see, FIG. 3) and loaded through the data input port D to be supplied from a master/slave (M/S) flip flop (FF) circuit through multiplexing circuits 150, the sensing circuit(s) 140(*y*), latch circuits 144(*y*) and buffer circuit(s) 146(*y*) to the sub-array data output port(s) $R_y$, as well as the data output port Q, for return to the ATPG circuit for comparison to the test pattern. In ATPG test mode, the multiplexing circuits 150 selectively pass the ATPG test pattern data from the M/S FF circuit. When not in ATPG test mode, the multiplexing circuits 150 selectively pass the memory data read from the memory array 112.

It will be noted that such BIST and ATPG testing does not provide for a complete testing of the entire read circuitry portion of the column I/O circuit 120. Notably, none of the sensing circuit(s) 140(*y*) are tested. Additionally, those skilled in the art will note that ATPG testing is typically only performed at memory start-up while BIST testing can be performed at specified intervals during memory operation. This is a concern in mission critical (such as safety) applications which require continued and periodic testing be performed on the memory during operation. There would be an advantage if BIST testing could be applied to support the complete testing of the entire read circuitry portion of the column I/O circuit 120.

Figure 5:
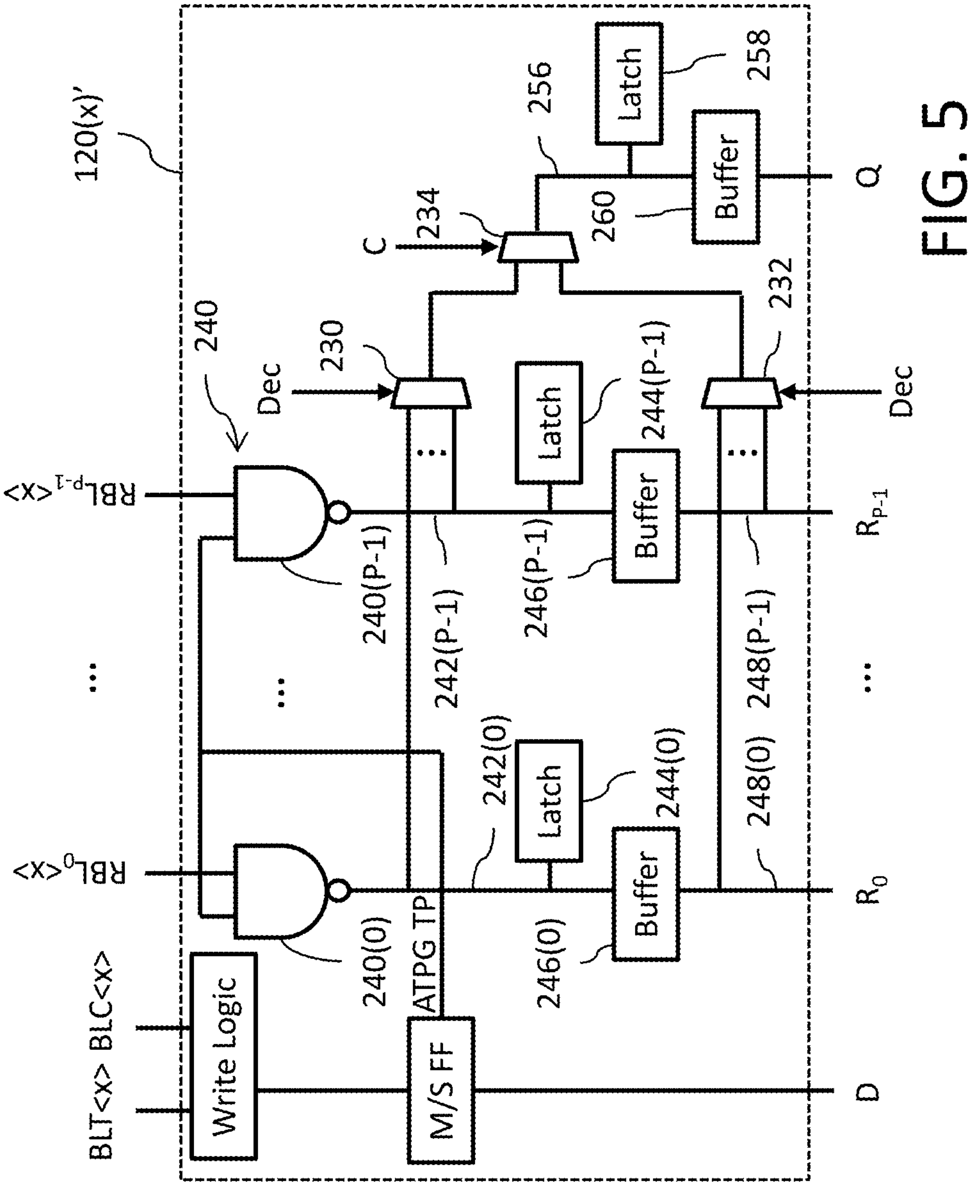
FIG. 5 shows a block diagram for an embodiment of a column I/O circuit for the memory circuit in FIG. 3.

Reference is now made to FIG. 5 which shows a block diagram of a further embodiment for the column I/O circuit 120'(*x*). Here, x=0 to M−1. The data input port D is coupled to the complementary (write) bit lines BLT and BLC through a write logic circuit. The column I/O circuit 120(*x*)' is coupled to the P local read bit lines $RBL_0$<x> to $RBL_{P-1}$<x> from the sub-arrays 113 for the column x in the array 112. Sensing circuitry 240, formed for example by a set of logic NAND gates, is coupled to receive the data on the P local read bit lines $RBL_0$<x> to $RBL_{P-1}$<x> and generate corresponding sensed data bits on signal lines 242(*y*). Each sensed data bit is latched by latch circuit 244(*y*) and buffered by buffer circuit 246(*y*) for output on signal line 248(*y*) at the sub-array data output port $R_y$. Here, y=0 to P−1. The sensed data bits on the signal lines 242(*y*) are further applied to the input of a first multiplexer circuit 230. The data bits on the signal lines 248(*y*) are further applied to the inputs of a second multiplexer circuit 232. The selection (control) inputs of the first and second multiplexer circuits 230 and 232 receive a control signal Dec that is generated by row decoder 118 and is thus dependent on the decoded address, the first or second mode of memory operation and the word line (or lines) that are selectively actuated in order to selectively pass one of the data signals on the signal lines 242(*y*) to the output of the first multiplexer circuit 230 and further selectively pass one of the data signals on a corresponding one of the signal lines 248(*y*) to the output of the second multiplexer circuit 232. The signal outputs of the first and second multiplexer are applied to the inputs of a third multiplexer circuit 234. The selection (control) input of the third multiplexer circuit 234 receives a control signal C. There are a number of options for the generation of control signal C: it can be controlled by the BIST circuit as part of the BIST testing operation to selectively pass the data signal output from the first multiplexer circuit 230 or the data signal output from the second multiplexer circuit 232; or it can be controlled in a fixed, for example, manner to a certain logic state based on criticality of the circuit application (for example, set to a first logic state for a safety critical application to pass output from multiplexer circuit 232 or set to a second logic state for high performance application to select output from multiplexer circuit 230). The data bit output from the third multiplexer circuit 234 on signal line 256 is latched by latch circuit 258 and buffered by buffer circuit 260 for output at the data output port Q.

With the use of logic NAND gates 240(0) to 240(P−1) for sensing circuitry 240, a first input of each NAND gate is coupled to a corresponding one of the local read bit lines RBL0<x> to RBLP−1<x>. The second inputs of the logic NAND gates 240(0) to 240(P−1) are coupled to receive a test pattern TP generated by an automated test pattern generation (ATPG) circuit (see, FIG. 3) and loaded through the data input port D to be supplied from a master/slave (M/S) flip flop (FF) circuit. In ATPG test mode, the data for the test pattern are passed through the logic NAND gates 240(0) to 240(P−1) to the corresponding signal lines 242(*y*). When not in ATPG test mode, the logic NAND gates 240(0) to 240(P−1) pass the data bits from the local read bit lines RBL0<x> to RBLP−1<x> to the corresponding signal lines 242(*y*).

In an implementation where ATPG test mode need not be supported, the sensing circuitry 240 may comprise logic NOT gates, in place of the logic NAND gates 240(0) to 240(P−1), such as with gates 140(0) to 140(P−1) shown in FIG. 4.

It will be noted that the implementation of the column I/O circuit 120' (x) as shown in FIG. 5 supports the testing of multiple data paths using BIST circuitry and indeed supports the complete testing of the entire read circuitry portion of the column I/O circuit 120'. One data path that is testable using BIST circuitry is the data path from the memory array 112 through the sensing circuit 240, latch circuit 258 and buffer circuit 260 to the data output port Q (when the control signal C has the first logic state in one BIST testing operation mode to select the output of the first multiplexer 230). Another path that is testable using BIST circuitry is the data path from the memory array 112 through the sensing circuit 240, latch circuit 244 and buffer circuit 246 (at the sub-array data output port $R_y$), latch circuit 256 and buffer circuit 258 to the data output port Q (where the control signal C has the second logic state in another BIST testing operation mode to select the output of the second multiplexer 232).

There is a load coupled to each of the sub-array data output ports $R_y$, and this will introduce a timing delay in the propagation of the BIST testing signals through the data path which includes the second multiplexer circuit 232 and the second input of the third multiplexer circuit 234. This timing delay may be a concern in certain BIST testing operations for mission critical (such as safety) applications which require a relatively speaking faster testing speed. It will also be noted that this timing delay is also present in the functional mode for the control scenario where the control signal C is set in the first logic state.

Figure 6:
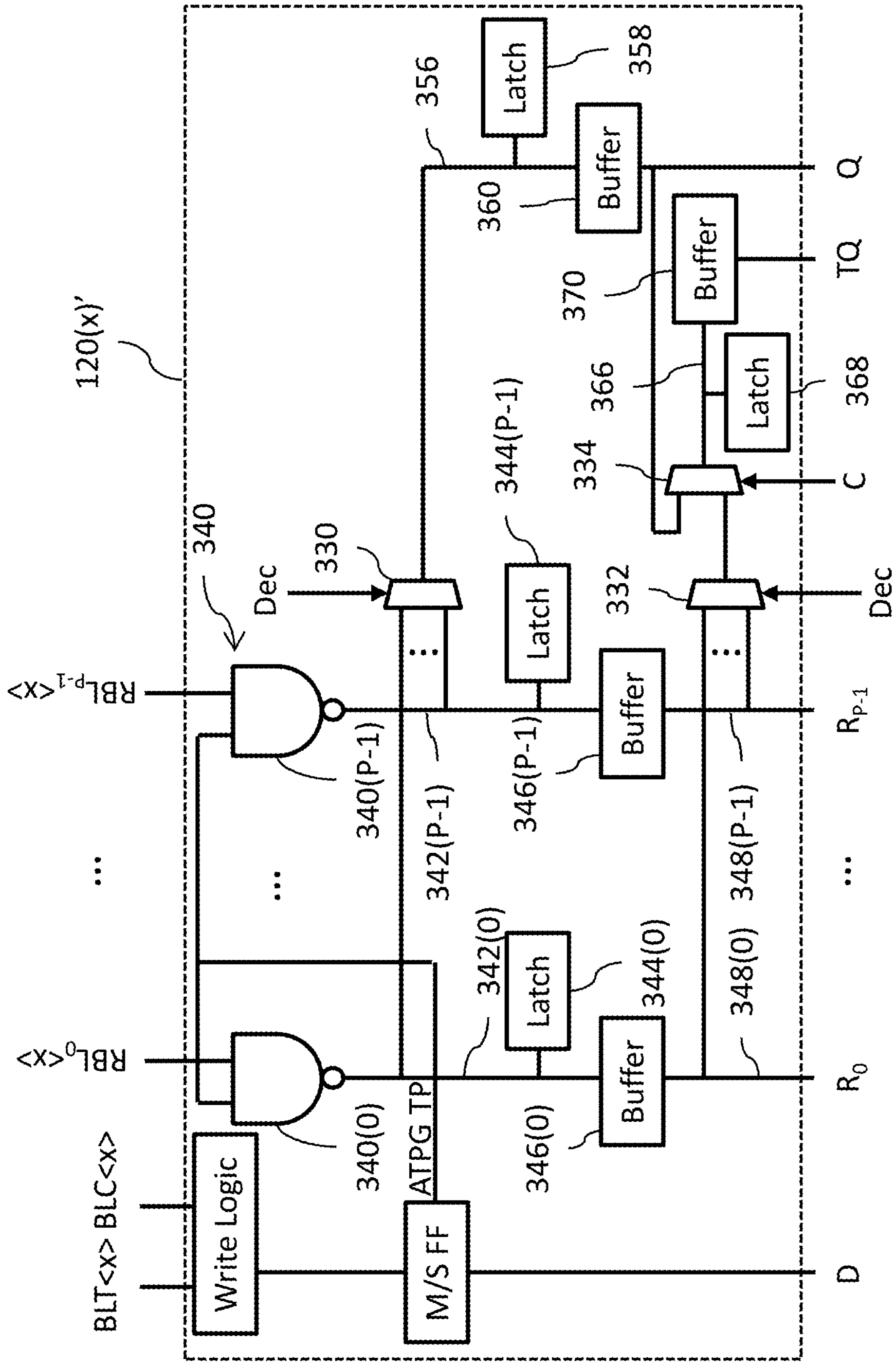
FIG. 6 shows a block diagram for an embodiment of a column I/O circuit for the memory circuit in FIG. 3.

Reference is now made to FIG. 6 which shows a block diagram of a further embodiment for the column I/O circuit 120'(*x*). Here, x=0 to M−1. The data input port D is coupled to the complementary (write) bit lines BLT and BLC through a write logic circuit. The column I/O circuit 120(*x*)' is coupled to the P local read bit lines $RBL_0$<x> to $RBL_{P-1}$<x> from the sub-arrays 113 for the column x in the array 112. Sensing circuitry 340, formed for example by a set of logic NAND gates, is coupled to receive the data on the P local read bit lines RBL0<x> to RBLP−1<x> and generate corresponding sensed data bits on signal lines 342(*y*). Each sensed data bit is latched by latch circuit 344(*y*) and buffered by buffer circuit 346(*y*) for output on signal line 348(*y*) at the sub-array data output port $R_y$. Here, y=0 to P−1. The sensed data bits on the signal lines 342(*y*) are further applied to the input of a first multiplexer circuit 330. The data bits on the signal lines 348(*y*) are further applied to the inputs of a second multiplexer circuit 332. The selection (control) inputs of the first and second multiplexer circuits 330 and 332 receive a control signal Dec that is generated by row decoder 118 and is thus dependent on the decoded address, the first or second mode of memory operation and the word line (or lines) that are selectively actuated in order to selectively pass one of the data signals on the signal lines 342(*y*) to the output of the first multiplexer 330 and selectively pass one of the data signals on the signal lines 348(*y*) to the output of the second multiplexer 332. The data bit output from the first multiplexer circuit 330 on signal line 356 is latched by latch circuit 358 and buffered by buffer circuit 360 for output at the data output port Q. The data bit output from the second multiplexer circuit 332 and the data bit at the data output port Q are applied to the inputs of a third multiplexer circuit 334. The selection (control) input of the third multiplexer circuit 334 receives the control signal C (described above). The data bit output from the third multiplexer circuit 334 on signal line 366 is latched by latch circuit 368 and buffered by buffer circuit 370 for output at a BIST testing data output port TQ.

With the use of logic NAND gates 340(0) to 340(P−1) for sensing circuitry 340, a first input of each NAND gate is coupled to a corresponding one of the local read bit lines RBL0<x> to RBLP−1<x>. The second inputs of the logic NAND gates 340(0) to 340(P−1) are coupled to receive a test pattern TP generated by an automated test pattern generation (ATPG) circuit and loaded through the data input port D to be supplied from a master/slave (M/S) flip flop (FF) circuit. In ATPG test mode, the data for the test pattern are passed through the logic NAND gates 340(0) to 340(P−1) to the corresponding signal lines 342(*y*). When not in ATPG test mode, the logic NAND gates 340(0) to 340(P−1) pass the data bits from the local read bit lines RBL0<x> to RBLP−1<x> to the corresponding signal lines 342(*y*).

In an implementation where ATPG test mode need not be supported, the sensing circuitry 340 may comprise logic NOT gates, in place of the logic NAND gates 340(0) to 340(P−1), such as with gates 140(0) to 140(P−1) shown in FIG. 4.

It will be noted that although the implementation of the column I/O circuit 120' as shown in FIG. 6 utilizes only the BIST-testable output port TQ, there is still full support for the testing of multiple data paths using BIST circuitry. Furthermore, this configuration also supports the complete testing of the entire read circuitry portion of the column I/O circuit 120'. One data path that is testable using BIST circuitry is the data path from the memory array 112 through the sensing circuit 340, latch circuit 358 and buffer circuit 360 (at the data port Q), latch circuit 368 and buffer circuit 370 to the test data output port TQ (where the control signal C has the first logic state in one BIST testing operation mode). Yet another path that is testable using BIST circuitry is the data path from the memory array 112 through the sensing circuit 340, latch circuit 344 and buffer circuit 346 (at the sub-array data output port $R_y$), latch circuit 368 and buffer circuit 370 to the test data output port TQ (where the control signal C has the second logic state in another BIST testing operation mode).

There is a load coupled to each of the sub-array data output ports $R_y$, and this will introduce a timing delay in the propagation of the BIST testing signals through the data path which includes the second multiplexer circuit 332 and the second input of the third multiplexer circuit 334. This timing delay may be a concern in certain BIST testing operations for mission critical (such as safety) applications which require a relatively speaking faster testing speed. However, in the configuration of FIG. 6, this timing delay is not a lag in the functional mode since the data paths for data output port Q and test data output port TQ are separate.

Figure 7:
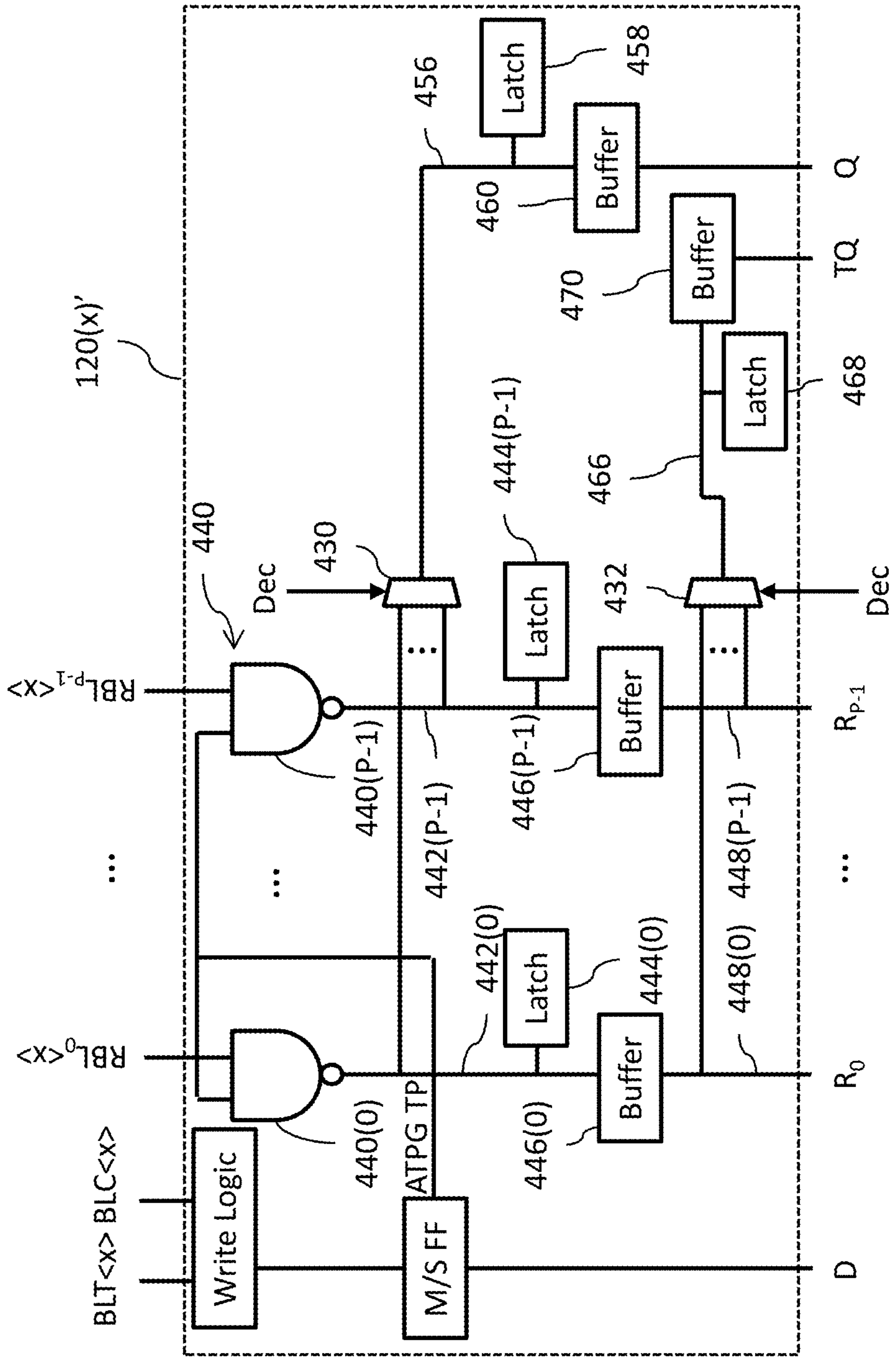
FIG. 7 shows a block diagram for an embodiment of a column I/O circuit for the memory circuit in FIG. 3.

Reference is now made to FIG. 7 which shows a block diagram of a further embodiment for the column I/O circuit 120'(*x*). Here, x=0 to M−1. The data input port D is coupled to the complementary (write) bit lines BLT and BLC through a write logic circuit. The column I/O circuit 120(*x*)' is coupled to the P local read bit lines $RBL_0$<x> to $RBL_{P-1}$<x> from the sub-arrays 113 for the column x in the array 112. Sensing circuitry 440, formed for example by a set of logic NAND gates, is coupled to receive the data on the P local read bit lines RBL0<x> to RBLP−1<x> and generate corresponding sensed data bits on signal lines 442(*y*). Each sensed data bit is latched by latch circuit 444(*y*) and buffered by buffer circuit 446(*y*) for output on signal line 448(*y*) at the sub-array data output port $R_y$. Here, y=0 to P−1. The sensed data bits on the signal lines 442(*y*) are further applied to the input of a first multiplexer circuit 430. The data bits on the signal lines 448(*y*) are further applied to the inputs of a second multiplexer circuit 432. The selection (control) inputs of the first and second multiplexer circuits 430 and 432 receive a control signal Dec that is generated by row decoder 118 and is thus dependent on the decoded address, the first or second mode of memory operation and the word line (or lines) that are selectively actuated in order to selectively pass one of the data signals on the signal lines 442(*y*) to the output of the first multiplexer 430 and to selectively pass one of the data signals on the signal lines 448(*y*) to the output of the second multiplexer 432. The data bit output from the first multiplexer circuit 430 on signal line

456 is latched by latch circuit 458 and buffered by buffer circuit 460 for output at the data output port Q. The data bit output from the second multiplexer circuit 432 on signal line 466 is latched by latch circuit 468 and buffered by buffer circuit 470 for output at a BIST testing data output port TQ.

With the use of logic NAND gates 440(0) to 440(P−1) for sensing circuitry 440, a first input of each NAND gate is coupled to a corresponding one of the local read bit lines RBL0<x> to RBLP−1<x>. The second inputs of the logic NAND gates 440(0) to 440(P−1) are coupled to receive a test pattern generated by an automated test pattern generation (ATPG) circuit and loaded through the data input port D to be supplied from a master/slave (M/S) flip flop (FF) circuit. In ATPG test mode, the data for the test pattern are passed through the logic NAND gates 440(0) to 440(P−1) to the corresponding signal lines 442(*y*). When not in ATPG test mode, the logic NAND gates 440(0) to 440(P−1) pass the data bits from the local read bit lines RBL0<x> to RBLP−1<x> to the corresponding signal lines 442(*y*).

In an implementation where ATPG test mode need not be supported, the sensing circuitry 440 may comprise logic NOT gates, in place of the logic NAND gates 440(0) to 440(P−1), such as with gates 140(0) to 140(P−1) shown in FIG. 4.

It will be noted that the implementation of the column I/O circuit 120' as shown in FIG. 7 utilizes a BIST-testable output port TQ. One data path that is testable using BIST circuitry is the data path from the memory array 112 through the sensing circuit 440, latch circuit 444, buffer circuit 446 (at the sub-array data output port $R_y$), latch circuit 468 and buffer circuit 470 to the data output port TQ. Another path that is testable using ATPG circuitry is the data path from the memory array 112 through the sensing circuit 440, latch circuit 458 and buffer circuit 460 to the data output port Q.

There is a load coupled to each of the sub-array data output ports $R_y$, and this will introduce a timing delay in the propagation of the BIST testing signals through the data path which includes the second multiplexer circuit 432. This timing delay may be a concern in certain BIST testing operations for mission critical (such as safety) applications which require a relatively speaking faster testing speed. However, in the configuration of FIG. 7, this timing delay is not a lag on the BIST testing through the data output port Q, it only has an effect on the BIST testing through the data output port TQ.

Figure 8:
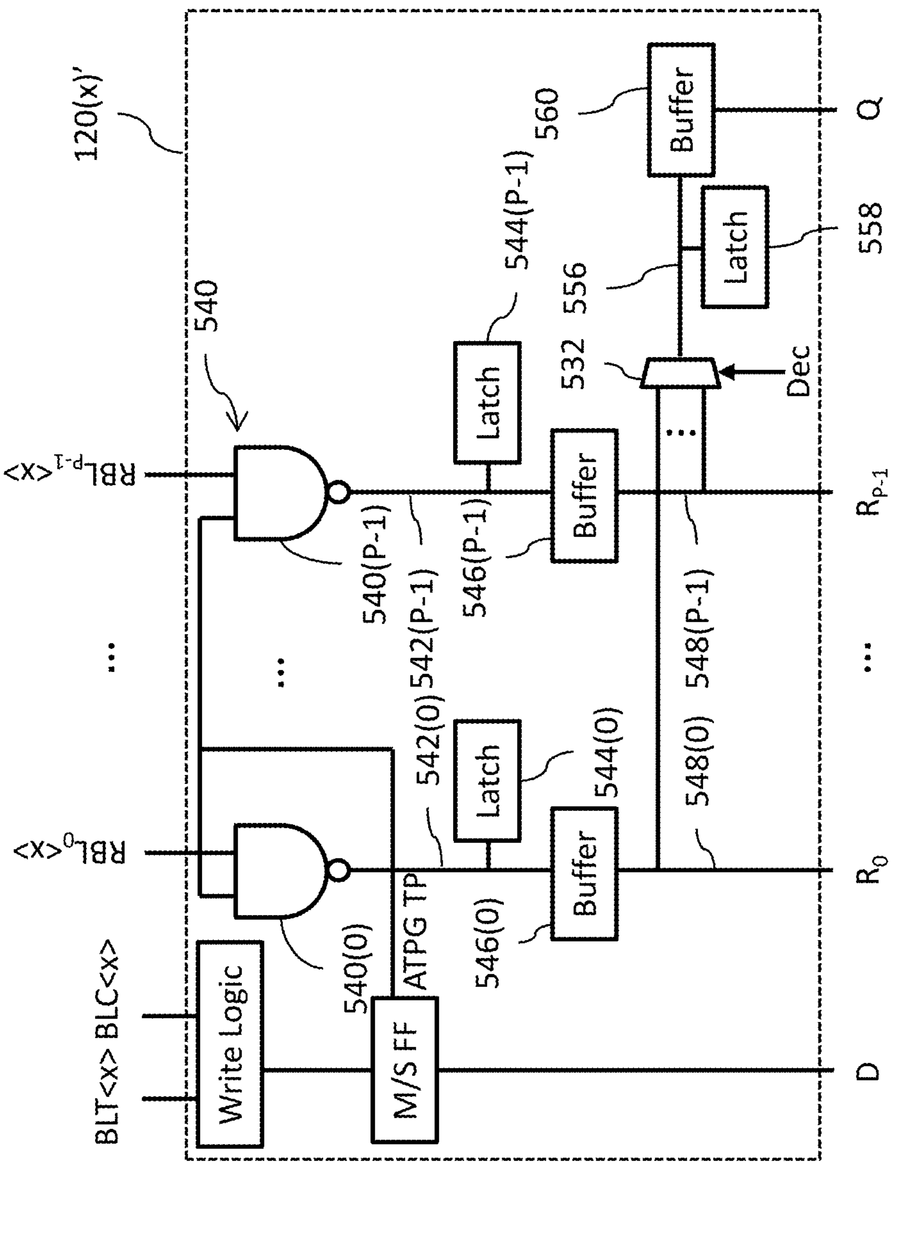
FIG. 8 shows a block diagram for an embodiment of a column I/O circuit for the memory circuit in FIG. 3.

Reference is now made to FIG. 8 which shows a block diagram of a further embodiment for the column I/O circuit 120'(*x*). Here, x=0 to M−1. The data input port D is coupled to the complementary (write) bit lines BLT and BLC through a write logic circuit. The column I/O circuit 120(*x*)' is coupled to the P local read bit lines $RBL_0$<x> to $RBL_{P-1}$<x> from the sub-arrays 113 for the column x in the array 112. Sensing circuitry 540, formed for example by a set of logic NAND gates, is coupled to receive the data on the P local read bit lines RBL0<x> to RBLP−1<x> and generate corresponding sensed data bits on signal lines 542 (*y*). Each sensed data bit is latched by latch circuit 544(*y*) and buffered by buffer circuit 546(*y*) for output on signal line 548(*y*) at the sub-array data output port $R_y$. Here, y=0 to P−1. The sensed data bits on the signal lines 548(*y*) are further applied to the input of a multiplexer circuit 532. The selection (control) input of the multiplexer circuit 432 receives a control signal Dec that is generated by row decoder 118 and is thus dependent on the decoded address, the first or second mode of memory operation and the word line (or lines) that are selectively actuated in order to selectively pass one of the data signals on the signal lines 448(*y*) to the output of the multiplexer 532. The data bit output from the multiplexer circuit 532 on signal line 556 is latched by latch circuit 558 and buffered by buffer circuit 560 for output at the data output port Q.

With the use of logic NAND gates 540(0) to 540(P−1) for sensing circuitry 540, a first input of each NAND gate is coupled to a corresponding one of the local read bit lines RBL0<x> to RBLP−1<x>. The second inputs of the logic NAND gates 540(0) to 540(P−1) are coupled to receive a test pattern generated by an automated test pattern generation (ATPG) circuit and loaded through the data input port D to be supplied from a master/slave (M/S) flip flop (FF) circuit. In ATPG test mode, the data for the test pattern are passed through the logic NAND gates 540(0) to 540(P−1) to the corresponding signal lines 542(*y*). When not in ATPG test mode, the logic NAND gates 540(0) to 540(P−1) pass the data bits from the local read bit lines RBL0<x> to RBLP−1<x> to the corresponding signal lines 542(*y*).

In an implementation where ATPG test mode need not be supported, the sensing circuitry 540 may comprise logic NOT gates, in place of the logic NAND gates 540(0) to 540(P−1), such as with gates 140(0) to 140(P−1) shown in FIG. 4.

It will be noted that the implementation of the column I/O circuit 120' as shown in FIG. 8 supports BIST testing of the entire read circuitry portion of the column I/O circuit 120'. The BIST testable data path is the data path from the memory array 112 through the sensing circuit 540, latch circuit 544, buffer circuit 546 (at the sub-array data output port $R_y$), latch circuit 558 and buffer circuit 460 to the data output port Q.

There is a load coupled to each of the sub-array data output ports $R_y$, and this will introduce a timing delay in the propagation of the BIST testing signals through the data path which includes the multiplexer circuit 532. Because of this timing delay, the implementation of FIG. 8 may not be suitable for use in certain BIST testing operations for mission critical (such as safety) applications which require a relatively speaking faster testing speed.

Figure 9:
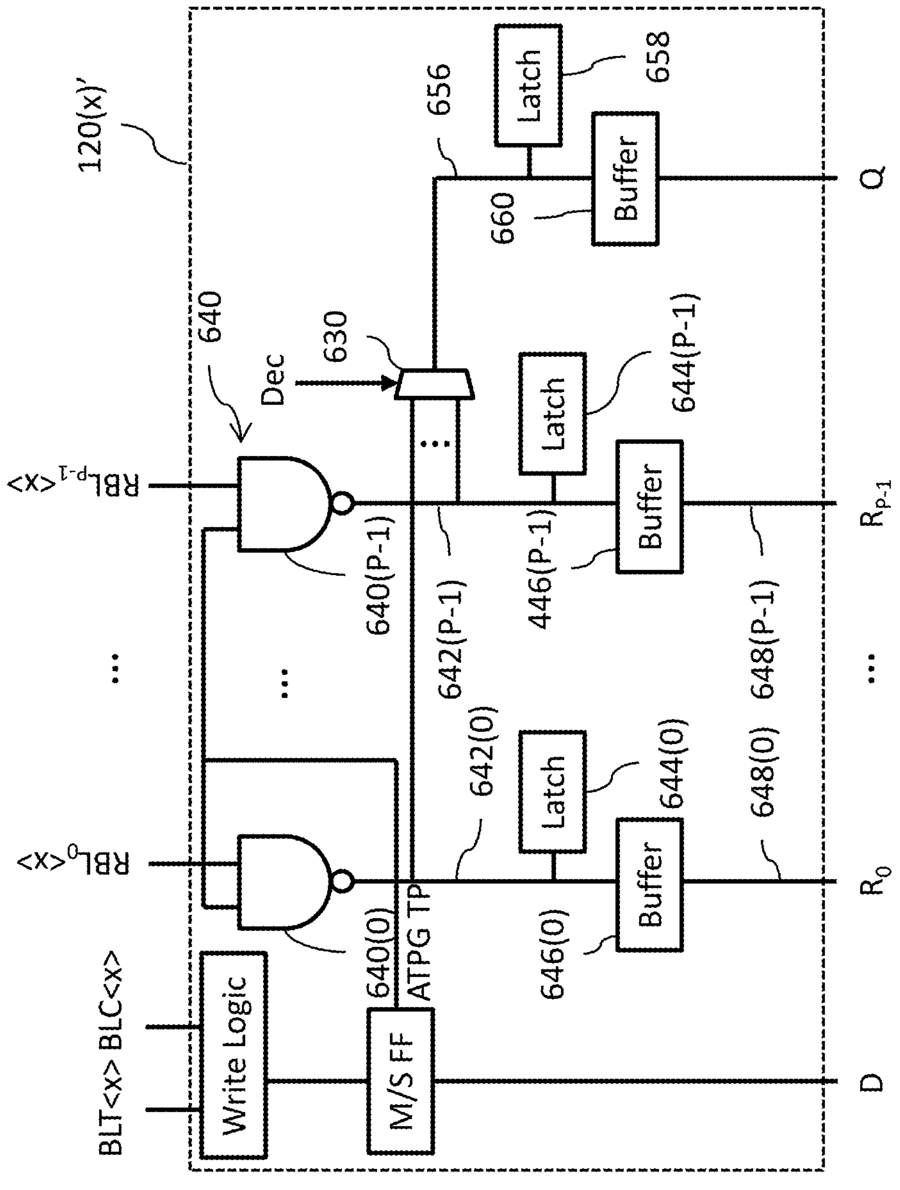
FIG. 9 shows a block diagram of a column I/O circuit for the memory circuit in FIG. 3.

Reference is now made to FIG. 9 which shows a block diagram of a further embodiment for the column I/O circuit 120'(*x*). Here, x=0 to M−1. The data input port D is coupled to the complementary (write) bit lines BLT and BLC through a write logic circuit. The column I/O circuit 120(*x*)' is coupled to the P local read bit lines $RBL_0$<x> to RBLP−1<x> from the sub-arrays 113 for the column x in the array 112. Sensing circuitry 640, formed for example by a set of logic NAND gates, is coupled to receive the data on the P local read bit lines RBL0<x> to RBLP−1<x> and generate corresponding sensed data bits on signal lines 642(*y*). Each sensed data bit is latched by latch circuit 644(*y*) and buffered by buffer circuit 646(*y*) for output on signal line 648(*y*) at the sub-array data output port $R_y$. Here, y=0 to P−1. The sensed data bits on the signal lines 642(*y*) are further applied to the input of a multiplexer circuit 630. The selection (control) input of the multiplexer circuit 630 receives a control signal Dec that is generated by row decoder 118 and is thus dependent on the decoded address, the first or second mode of memory operation and the word line (or lines) that are selectively actuated in order to selectively pass one of the data signals on the signal lines 642(*y*) to the output of the multiplexer circuit 630. The data bit output from the multiplexer circuit 630 on signal line 656 is latched by latch circuit 658 and buffered by buffer circuit 660 for output at the data output port Q.

With the use of logic NAND gates 640(0) to 640(P−1) for sensing circuitry 640, a first input of each NAND gate is coupled to a corresponding one of the local read bit lines RBL0<x> to RBLP−1<x>. The second inputs of the logic NAND gates 640(0) to 640(P−1) are coupled to receive a test pattern generated by an automated test pattern generation (ATPG) circuit and loaded through the data input port D to be supplied from a master/slave (M/S) flip flop (FF) circuit. In ATPG test mode, the data for the test pattern are passed through the logic NAND gates 640(0) to 640(P−1) to the corresponding signal lines 642($y$). When not in ATPG test mode, the logic NAND gates 640(0) to 640(P−1) pass the data bits from the local read bit lines RBL0<x> to RBLP−1<x> to the corresponding signal lines 642($y$).

In an implementation where ATPG test mode need not be supported, the sensing circuitry 640 may comprise logic NOT gates, in place of the logic NAND gates 640(0) to 640(P−1), such as with gates 140(0) to 140(P−1) shown in FIG. 4.

It will be noted that the implementation of the column I/O circuit 120' as shown in FIG. 8 does not support BIST circuitry testing of the entire read circuitry portion of the column I/O circuit 120'. The data path that is testable using BIST circuitry is the data path from the memory array 112 through the sensing circuit 640, latch circuit 658 and buffer circuit 660 to the data output port Q. Testing of the data path from the memory array 112 through the sensing circuit 640, latch circuit 644, and buffer circuit 646 (at the sub-array data output port $R_y$) must be implemented using ATPG testing.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A memory circuit, comprising:

a memory array including a plurality of sub-arrays, wherein each sub-array includes memory cells arranged in a matrix with plural rows and plural columns, each row including a word line connected to the memory cells of the row, and each column including a local bit line connected to the memory cells of the column;

a word line drive circuit for each row having an output connected to drive the word line of the row;

a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read; and an input/output circuit for each column comprising:

a plurality of bit line inputs coupled to the local bit lines of the sub-arrays;

a column data output coupled to the plurality of bit line inputs; and a plurality of sub-array data outputs, where each sub-array data output is coupled to a corresponding bit line input.

2. The circuit of claim 1, wherein each memory cell comprises a static random access memory (SRAM) cell.

3. The circuit of claim 1, further comprising test circuitry configured to pass test pattern data to the plurality of bit line inputs of the input/output circuit for each column and generate output test data at the column data output.

4. The circuit of claim 3, further comprising an automated test pattern generation (ATPG) circuit configured, in a testing operation, to generate the test pattern data and further configured to receive the output test data from the column data output.

5. The circuit of claim 3, wherein the input/output circuit for each column further comprises:

a first multiplexing circuit having inputs coupled to the plurality of sub-array data outputs;

a second multiplexing circuit having inputs coupled to the plurality of bit line inputs; and a third multiplexing circuit having inputs coupled to outputs of the first and second multiplexing circuits and an output coupled to the column data output.

6. The circuit of claim 5, wherein selection by each of the first and second multiplexing circuits is made in response to a control signal generated by the row decoder circuit responsive to the word line in the first mode or word lines actuation in the second mode.

7. The circuit of claim 5, wherein selection by the third multiplexing circuit is made in response to a control signal generated by a built-in self test (BIST) control circuit.

8. The circuit of claim 5, wherein selection by the third multiplexing circuit is made in response to a control signal generated dependent on criticality of circuit application.

9. The circuit of claim 5, further comprising a built-in self test (BIST) circuit configured to apply test data to the memory cells of the memory array and further configured to receive output test data from the column data output in a testing operation, wherein the output test data passes through the first and third multiplexing circuits to the column data output in a first BIST operation, and passes through the second and third multiplexing circuits to the column data output in a second BIST operation.

10. The circuit of claim 3, wherein the input/output circuit for each column further comprises:

a first multiplexing circuit having inputs coupled to the plurality of sub-array data outputs;

a second multiplexing circuit having inputs coupled to the plurality of bit line inputs and an output coupled to the column data output; and a third multiplexing circuit having inputs coupled to an output of the first multiplexing circuit and the column data output and an output coupled to a column test data output.

11. The circuit of claim 10, wherein selection by each of the first and second multiplexing circuits is made in response to a control signal generated by the row decoder circuit responsive to the word line in the first mode or word lines actuation in the second mode.

12. The circuit of claim 10, wherein selection by the third multiplexing circuit is made in response to a control signal generated by a built-in self test (BIST) control circuit.

13. The circuit of claim 10, wherein selection by the third multiplexing circuit is made in response to a control signal generated dependent on criticality of circuit application.

14. The circuit of claim 10, further comprising a built-in self test (BIST) circuit configured to apply test data to the memory cells of the memory array and further configured to receive output test data from the column test data output in a testing operation, wherein the output test data passes through the first and third multiplexing circuits to the column test data output in a first BIST operation, and passes through the second and third multiplexing circuits to the column test data output in a second BIST operation.

15. The circuit of claim 3, wherein the input/output circuit for each column further comprises:

a first multiplexing circuit having inputs coupled to the plurality of sub-array data outputs and an output coupled to the column data output; and a second multiplexing circuit having inputs coupled to the plurality of bit line inputs and an output coupled to a column test data output.

16. The circuit of claim 15, wherein selection by each of the first and second multiplexing circuits is made in response to a control signal generated by the row decoder circuit responsive to the word line in the first mode or word lines actuation in the second mode.

17. The circuit of claim 15, further comprising an automated test pattern generated (ATPG) circuit configured to apply test data to the memory cells of the memory array and further configured to receive output test data from the column data output in a testing operation, wherein the output test data passes through the second multiplexing circuit to the column data output in an ATPG operation.

18. The circuit of claim 15, further comprising a built-in self test (BIST) circuit configured to apply test data to the memory cells of the memory array and further configured to receive output test data from the column test data output in a testing operation, wherein the output test data passes through the first multiplexing circuit to the column test data output in a BIST operation.

19. The circuit of claim 15, further comprising a built-in self test (BIST) circuit configured to apply test data to the memory cells of the memory array and further configured to receive output test data from one or more of the column data output and the column test data output in a testing operation.

20. The circuit of claim 3, wherein the input/output circuit for each column further comprises:

a multiplexing circuit having inputs coupled to the plurality of sub-array data outputs and an output coupled to the column data output.

21. The circuit of claim 20, wherein selection by multiplexing circuit is made in response to a control signal generated by the row decoder circuit responsive to the word line in the first mode or word lines actuation in the second mode.

22. The circuit of claim 20, further comprising a built-in self test (BIST) circuit configured to apply test data to the memory cells of the memory array and further configured to receive output test data from the column data output in a testing operation, wherein the output test data passes through the multiplexing circuit to the column data output in a BIST operation.

23. The circuit of claim 3, wherein the input/output circuit for each column further comprises:

a multiplexing circuit having inputs coupled to the plurality of bit line inputs and an output coupled to the column data output.

24. The circuit of claim 23, wherein selection by the multiplexing circuit is made in response to a control signal generated by the row decoder circuit responsive to the word line in the first mode or word lines actuation in the second mode.

25. The circuit of claim 23, further comprising a built-in self test (BIST) circuit configured to apply test data to the memory cells of the memory array and further configured to receive output test data from the column data output in a testing operation, wherein the output test data passes through the multiplexing circuit to the column data output in a BIST operation.

26. The circuit of claim 1, further comprising test circuitry configured to pass test pattern data to the plurality of bit line inputs of the input/output circuit for each column and generate output test data at the plurality of sub-array data outputs.

27. The circuit of claim 26, further comprising an automated test pattern generation (ATPG) circuit configured, in a testing operation, to generate the test pattern data and further configured to receive the output test data from the plurality of sub-array data outputs.

* * * * *